United States Patent
Watanabe et al.

(10) Patent No.: US 7,884,431 B2
(45) Date of Patent: Feb. 8, 2011

(54) MEMS DEVICE HAVING A MOVABLE ELECTRODE

(75) Inventors: Toru Watanabe, Matsumoto (JP); Akira Sato, Fujimi (JP); Shogo Inaba, Shiojiri (JP); Takeshi Mori, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/710,773

(22) Filed: Feb. 23, 2010

(65) Prior Publication Data

US 2010/0148284 A1    Jun. 17, 2010

Related U.S. Application Data

(63) Continuation of application No. 11/876,107, filed on Oct. 22, 2007, now Pat. No. 7,696,587.

(30) Foreign Application Priority Data

Oct. 24, 2006  (JP) .............................. 2006-289063
Jul. 13, 2007  (JP) .............................. 2007-184020

(51) Int. Cl.
*H01L 27/14* (2006.01)
*H01L 29/82* (2006.01)
*H01L 29/84* (2006.01)

(52) U.S. Cl. .................... 257/415; 257/414; 257/417; 257/418; 257/419; 257/420; 257/E29.324

(58) Field of Classification Search ......... 257/414–415, 257/417–420, E29.324
See application file for complete search history.

(56) References Cited

U.S. PATENT DOCUMENTS

| 4,507,705 | A | | 3/1985 | Hoshino et al. ......... 361/283.1 |
|---|---|---|---|---|
| 5,472,539 | A | * | 12/1995 | Saia et al. .................... 156/155 |
| 5,619,050 | A | | 4/1997 | Uenoyama et al. .......... 257/254 |
| 5,811,693 | A | | 9/1998 | Okada .................... 73/862.043 |
| 5,914,520 | A | * | 6/1999 | Werner ........................ 257/415 |
| 6,046,659 | A | | 4/2000 | Loo et al. .................... 333/262 |
| 6,933,165 | B2 | | 8/2005 | Musolf et al. ................. 438/50 |
| 7,071,017 | B2 | | 7/2006 | Suzuki ......................... 438/52 |
| 7,154,654 | B2 | | 12/2006 | Kimura ...................... 359/237 |
| 7,164,334 | B2 | | 1/2007 | Shirakawa .................. 200/181 |
| 7,602,097 | B2 | * | 10/2009 | Nakamura .................. 310/309 |
| 2002/0021860 | A1 | | 2/2002 | Ruan et al. .................... 385/18 |
| 2004/0012057 | A1 | | 1/2004 | Bennett et al. .............. 257/414 |
| 2004/0150939 | A1 | * | 8/2004 | Huff ............................ 361/277 |
| 2004/0157426 | A1 | | 8/2004 | Ouellet et al. .............. 438/618 |
| 2004/0233503 | A1 | * | 11/2004 | Kimura ...................... 359/275 |
| 2005/0001701 | A1 | * | 1/2005 | Shirakawa .................. 335/78 |
| 2005/0032266 | A1 | | 2/2005 | Suzuki ......................... 438/50 |
| 2005/0126290 | A1 | | 6/2005 | Yamaguchi ............... 73/514.16 |
| 2006/0006484 | A1 | * | 1/2006 | Seneviratne et al. ........ 257/415 |

(Continued)

FOREIGN PATENT DOCUMENTS

| JP | 2005-224934 | 8/2005 |
|---|---|---|
| JP | 2006-173647 | 6/2006 |
| JP | 2006-174174 | 6/2006 |

*Primary Examiner*—Ida M Soward
(74) *Attorney, Agent, or Firm*—Harness, Dickey & Pierce, P.L.C.

(57) ABSTRACT

A microelectromechanical system (MEMS) device includes a semiconductor substrate, a MEMS including a fixed electrode and a movable electrode formed on the semiconductor substrate through an insulating layer, and a well formed in the semiconductor substrate below the fixed electrode. The well is one of an n-type well and a p-type well. The p-type well applies a positive voltage to the fixed electrode while the n-type well applies a negative voltage to the fixed electrode.

5 Claims, 13 Drawing Sheets

U.S. PATENT DOCUMENTS

| | | | |
|---|---|---|---|
| 2006/0038301 A1* | 2/2006 | Suzuki | 257/775 |
| 2006/0134821 A1 | 6/2006 | Combi et al. | 438/52 |
| 2006/0164710 A1* | 7/2006 | Fujii et al. | 359/224 |
| 2006/0180882 A1 | 8/2006 | Sato et al. | 257/414 |
| 2006/0181379 A1 | 8/2006 | Schwartz et al. | 335/78 |
| 2006/0284183 A1* | 12/2006 | Izumi et al. | 257/75 |
| 2007/0018761 A1 | 1/2007 | Yamanaka et al. | 335/78 |
| 2007/0035579 A1 | 2/2007 | Bibl et al. | 347/40 |
| 2007/0215965 A1 | 9/2007 | Yang et al. | 257/415 |
| 2008/0211875 A1* | 9/2008 | Silverbrook | 347/54 |
| 2009/0021884 A1 | 1/2009 | Nakamura | 361/233 |
| 2009/0201623 A1 | 8/2009 | Steeneken | 361/290 |
| 2010/0044808 A1* | 2/2010 | Dekker et al. | 257/415 |
| 2010/0079849 A1* | 4/2010 | Floyd | 359/291 |

* cited by examiner

US 7,884,431 B2

MEMS DEVICE HAVING A MOVABLE ELECTRODE

CROSS-REFERENCE TO RELATED APPLICATIONS

This application is a continuation application of U.S. Ser. No. 11/876,107 filed Oct. 22, 2007, which claims priority to Japanese Patent Application Nos. 2006-289063 filed Oct. 24, 2006 and 2007-184020 filed Jul. 13, 2007, all of which are hereby expressly incorporated by reference herein in their entirety.

BACKGROUND

1. Technical Field

The present invention relates to a Micro Electro Mechanical System (MEMS) device.

2. Related Art

MEMS devices manufactured by using MEMS technology have recently been drawing great attention. Such MEMS devices include a minute MEMS formed on a semiconductor substrate so as to be utilizable for sensors or resonators. The MEMS is provided with a fixed electrode and a movable electrode. By bending the movable electrode, an electrostatic capacitance generated at the fixed electrode is detected to thereby provide MEMS characteristics.

In general, it has been known that parasitic capacitance included in some circuit wirings such as ICs will adversely affect the electrical characteristic of ICs and the like. Parasitic capacitance also occurs in MEMS devices. An adverse effect on the electrical characteristic caused by the parasitic capacitance is worsened as the space between electrodes in the MEMS becomes narrower and the applied frequency becomes higher.

Parasitic capacitance is easily formed between the semiconductor substrate and the MEMS when the MEMS is produced through a surface MEMS process in which the MEMS is directly formed on an extremely thin oxide film or nitride film on a semiconductor substrate This is true even when the MEMS occupies a small area.

In particular, an electrostatic type MEMS device for detecting volume displacement generated by mechanical displacement of a movable electrode has an extremely weak output signal. In addition, since an absolute value of the volume displacement is not sufficiently large with respect to parasitic capacitance, the signal is easily affected by the parasitic capacitance.

Further, when the parasitic capacitance is large and the resistance of a surface of the substrate is small, or when a capacitance between the substrate and an electrode is large, the signal is easily leaked from pathways other than the original pathway through carriers excited on the surface of the substrate.

For example, FIG. 16 illustrates a known MEMS device that includes a MEMS formed on an oxide film 111 and a nitride film 112 on a semiconductor substrate 110. The MEMS device is provided with fixed electrodes and a movable electrode. The fixed electrodes include an input electrode 113, an output electrode 114 and a driving electrode 115. The movable electrode includes a movable portion 116 coupled to the input electrode 113.

In a MEMS device having the above structure, a high-frequency signal may leak from the input electrode 113 to the output electrode 114 through the surface of the semiconductor substrate 110.

To solve this problem, JP-A-2006-174174 (page 5, lines 7 to 11) discloses a leakage amount reduction technique for a high-frequency signal to a substrate by collectively and commonly coupling lower electrodes of a resonator element (MEMS) so as to reduce an area occupied by the wiring of the high-frequency signal.

However, although reducing the area occupied by the MEMS as described above is an effective method for decreasing parasitic capacitance, reducing the occupied area is not always easily accomplished due to restrictions of designs and/or production. Therefore, when the area occupied by the MEMS is not capable of being successfully reduced, the parasitic capacitance causes an adverse effect to the characteristics of the MEMS device.

SUMMARY

A MEMS device is provided to reduce parasitic capacitance between a MEMS and a semiconductor substrate.

A MEMS device according to a first aspect includes: a semiconductor substrate; a MEMS including a fixed electrode and a movable electrode formed on the semiconductor substrate through an insulating layer; and a well formed in the semiconductor substrate below the fixed electrode. The well is one of an n-type well and a p-type well. The p-type well is formed to apply a positive voltage to the fixed electrode while the n-type well is formed to apply a negative voltage to the fixed electrode.

According to this structure, the well is formed in the semiconductor substrate below the fixed electrode of the MEMS. A p-type well applies a positive voltage to the fixed electrode of the MEMS. An n-type well applies a negative voltage to the fixed electrode of the MEMS.

By forming the well, a surface of the semiconductor substrate provided with the well becomes depleted. As such, an apparent distance between the electrodes facing each other is increased due to the depletion layer. As a result, parasitic capacitance in this portion is decreased. Therefore, the parasitic capacitance between the MEMS and the semiconductor substrate can be reduced, so that leakage of a high frequency signal through the surface of the semiconductor substrate is prevented, thereby stabilizing the characteristics of the MEMS device.

Further, a voltage may be applied to the well so that the well is depleted.

According to this structure, the voltage is applied to the well formed in the semiconductor substrate located below the fixed electrode so that the well is in a depleted state.

When a voltage having a large absolute value is applied to the fixed electrode, an inversion layer is generated on the surface of the semiconductor substrate provided with the well, thereby exciting electrons. In this state, signal leakage occurs easily on the surface of the semiconductor substrate regardless of a depletion capacitance. Therefore, by applying a voltage obtained by subtracting a voltage when the well is depleted from a voltage applied to the fixed electrode, the well can maintain the depletion state, thereby preventing the electrons from being excited by the inversion layer generated on the surface of the semiconductor substrate provided with the well. Since the well can maintain the depletion state, the parasitic capacitance between the MEMS and the semiconductor substrate can be reduced. Therefore, leakage of the high frequency signal through the surface of the semiconductor substrate is prevented, thereby stabilizing the characteristics of the MEMS device.

Further, the MEMS device may satisfy $Vp<0$, $Vwell \geq 0$, and $0<|Vp-Vwell|<|Vth|$, where $Vp$ is a bias voltage of the MEMS, Vwell is a voltage applied to the well below the MEMS, Vth is a threshold voltage at which an inversion layer is formed in the well when the semiconductor substrate is a p-type substrate and the well is an n-type well.

By satisfying the above conditions, when the semiconductor substrate is a p-type substrate and the well is an n-type well, the well formed in the semiconductor substrate below the fixed electrode is depleted. Then, due to the depletion layer generated in the well, the apparent distance between the electrodes facing each other is increased, thereby decreasing the parasitic capacitance in this portion. Therefore, the parasitic capacitance between the MEMS and the semiconductor substrate can be reduced, so that leakage of the high frequency signal through the surface of the semiconductor substrate is prevented, thereby stabilizing the characteristics of the MEMS device.

Further, the MEMS device may satisfy Vp>0, Vwell<0, and 0<|Vp−Vwell|<|Vth|, where Vp is the bias voltage of the MEMS, Vwell is the voltage applied to the well below the MEMS, Vth is the threshold voltage at which an inversion layer is formed in the well when the semiconductor substrate is an n-type substrate and the well is a p-type well.

By satisfying the above conditions, when the semiconductor substrate is an n-type substrate and the well is a p-type well, the well formed in the semiconductor substrate below the fixed electrode is depleted. Then, due to the depletion layer generated in the well, the apparent distance between the electrodes facing each other is increased, thereby decreasing the parasitic capacitance in this portion. Therefore, the parasitic capacitance between the MEMS and the semiconductor substrate can be reduced, so that leakage of the high frequency signal through the surface of the semiconductor substrate is prevented, thereby stabilizing the characteristics of the MEMS device.

A MEMS device according to a second aspect includes: a semiconductor substrate; a MEMS including a fixed electrode and a movable electrode formed on the semiconductor substrate through an insulating layer; and a well formed in the semiconductor substrate below the fixed electrode, the well having the same polarity as a polarity of the semiconductor substrate; and an isolation well having a polarity opposite to the polarity of the well and surrounding the well in the semiconductor substrate. The well and the isolation well are in a reverse bias state. Likewise, the isolation well and the semiconductor substrate are in a reverse bias state.

According to this structure, the potentials of the semiconductor substrate and the well are isolated, thereby enabling operation of the MEMS with a voltage having a high absolute value. As a result, a parasitic capacitance between the MEMS and the semiconductor substrate is reduced. Further, employing such a structure can facilitate the use of the MEMS by integrating it with a circuit such as an IC since the potential of the well does not affect the potential of the semiconductor substrate.

In this case, the MEMS device may satisfy Vp>0, and 0<Vp−Vwell<Vth, where Vp is a bias voltage of the MEMS, Vwell is a voltage applied to the well below the MEMS, Vth is a threshold voltage at which an inversion layer is formed in the well, when the semiconductor substrate is a p-type substrate, the well is a p-type well, and the isolation well is an n-type well.

By satisfying the above conditions, when the semiconductor substrate is a p-type substrate, the well is a p-type well, and the isolation well is an n-type well, the well formed in the semiconductor substrate below the fixed electrode is depleted. Then, due to the depletion layer generated in the well, an apparent distance between the electrodes facing each other is increased, thereby decreasing the parasitic capacitance in this portion. Therefore, the parasitic capacitance between the MEMS and the semiconductor substrate can be reduced, so that leakage of a high frequency signal through the surface of the semiconductor substrate is prevented, thereby stabilizing the characteristics of the MEMS device.

In this case, the MEMS device may satisfy Vp<0, and 0<Vp−Vwell<Vth, where Vp is the bias voltage of the MEMS, Vwell is the voltage applied to the well below the MEMS, Vth is the threshold voltage at which an inversion layer is formed in the well, when the semiconductor substrate is an n-type substrate, the well is an n-type well, and the isolation well is a p-type well.

By satisfying the above conditions, when the semiconductor substrate is an n-type substrate, the well is an n-type well, and the isolation well is a p-type well, the well formed in the semiconductor substrate below the fixed electrode is depleted. Then, due to the depletion layer generated in the well, the apparent distance between the electrodes facing each other is increased, thereby decreasing the parasitic capacitance in this portion. Therefore, the parasitic capacitance between the MEMS and the semiconductor substrate can be reduced, so that leakage of the high frequency signal through the surface of the semiconductor substrate is prevented, thereby stabilizing the characteristics of the MEMS device.

BRIEF DESCRIPTION OF THE DRAWINGS

Embodiments of the invention will be described with reference to the accompanying drawings, wherein like numbers reference like elements.

FIG. 1A is a schematic plan view of the MEMS device, while FIG. 1B is a partial schematic sectional view taken along line A-A of FIG. 1A.

FIG. 9A is a partial schematic plan view of the MEMS device, while FIG. 1B is a partial schematic sectional view taken along line B-B of FIG. 9A.

FIG. 13A is a schematic plan view of the MEMS device, while FIG. 13B is a partial schematic sectional view taken along line C-C of FIG. 13A.

DESCRIPTION OF EXEMPLARY EMBODIMENTS

Figure 1A:
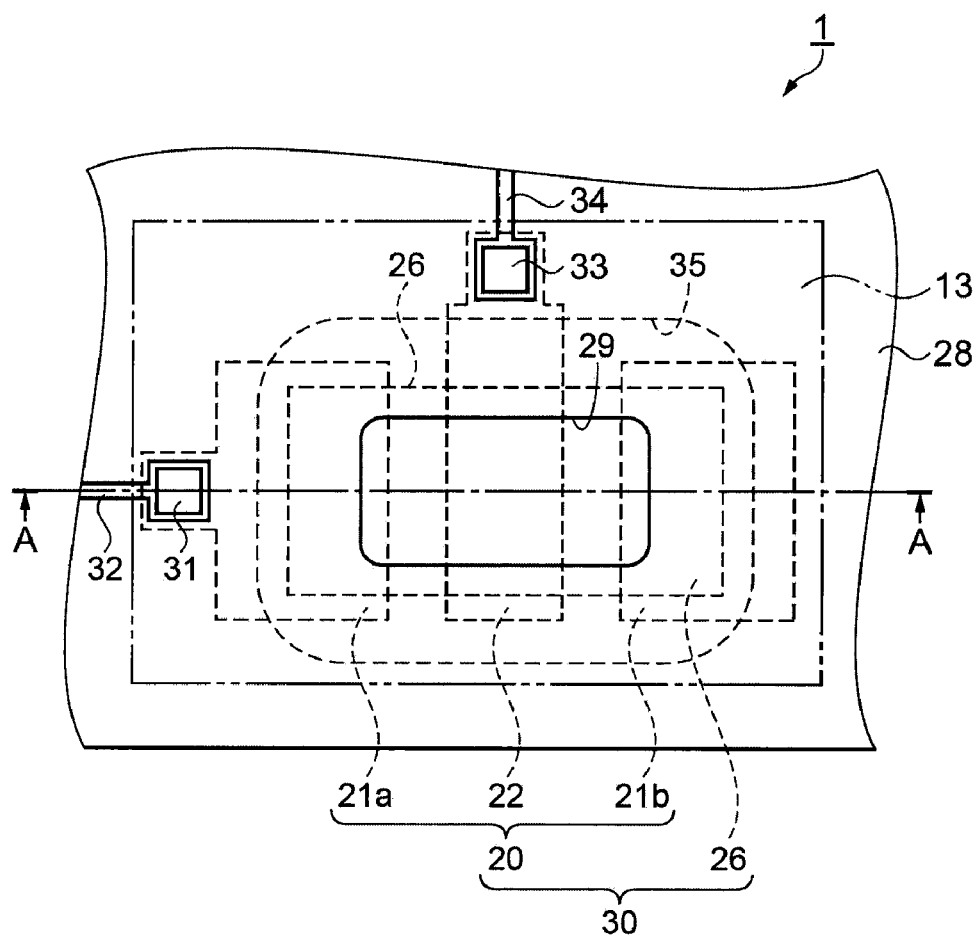
FIGS. 1A and 1B show a structure of a MEMS device according to a first embodiment.

Before embodiments of the invention are explained and in order to facilitate a better understanding, a principle by which a signal leaks from pathways other than an original one due to parasitic capacitance generated in a semiconductor substrate will be explained.

The phenomenon described above can be explained by using a model including a capacitor having a metal formed on a semiconductor through an insulator. Hence, a MOS capacitor using a p-type semiconductor is exemplified. In a MOS capacitor using a p-type semiconductor, it is known that a characteristic of a capacitance-voltage shows: an accumulation state when a negative voltage is applied to a gate; a depletion state when a positive voltage is applied to the gate; and an inversion state when a large positive voltage is applied to the gate.

In the accumulation state, a carrier (hole) is generated on a surface of the substrate and conductor resistance in the vicinity of the surface of the substrate lowers. As such, signal leakage in a lateral direction easily occurs.

On the other hand, in the depletion state, an apparent distance between electrodes facing each other is increased, thereby decreasing a parasitic capacitance in this portion. Therefore, the carrier is not generated in the vicinity of the surface of the substrate which makes signal leakage in the lateral direction less likely to occur. Further, in the inversion state, an inversion layer is generated and a carrier having an opposite polarity is excited there. Signal leakage on the surface of the substrate in the lateral direction thus easily occurs.

In the depletion state, the signal leakage in the lateral direction is not likely to occur on the surface of the substrate. Further, since the MEMS device drives with a high voltage in general, as the voltage (threshold voltage) value at which the inversion layer is generated increases, the likelihood that the signal leakage on the surface of the substrate occurs reduces.

Further, in a case where a well is formed in the semiconductor substrate, when a voltage is applied to the surface of the substrate, the inversion layer is less likely to occur until a higher voltage is applied.

The voltage at which the inversion layer is generated in a MOS capacitor can be represented by a formula deriving a threshold voltage of a MOS transistor. The threshold voltage Vt in a case of using a p-type well is shown as formula 1.

$$V_t = \frac{2k \cdot T}{q} \ln\left(\frac{N_A}{n_i}\right) + \frac{2}{C_i} \sqrt{\varepsilon_0 \cdot \varepsilon_s \cdot k \cdot T \cdot N_A \cdot \ln\frac{N_A}{n_i}}$$ Formula 1 where the symbols used indicate as follows:
k: Boltzmann constant
T: Temperature
q: Absolute value of electric charge
$N_A$: Acceptor concentration
$n_i$: Intrinsic carrier concentration
$C_i$: Capacitance of insulating film per unit area
$\varepsilon_O$: Permittivity in vacuum, and
$\varepsilon_S$: Relative dielectric constant of insulating film.

According to this formula, a threshold voltage at which inversion starts depends on the acceptor concentration of a part of the semiconductor substrate. The acceptor concentration can be nearly approximated by a carrier concentration of the well. Therefore, it is apparent that the higher the carrier concentration is, the more it is likely that the MOS capacitor can maintain a depletion state up to a higher voltage.

Further, in a case where a well is not formed and a p-type silicon substrate is used as it is, a carrier concentration of the substrate becomes smaller than a case where the well is formed. Therefore, according to formula 1, it is understandable that the voltage at which the inversion layer is generated becomes low, resulting in narrowing a voltage range used in the depletion state. Accordingly, forming the well enables reduction of the parasitic capacitance in the MEMS device in a wider voltage range.

Further, when the well is formed, it is possible to form an optimum substrate structure below the fixed electrode of the MEMS without depending on a type of substrate (a p-type substrate or an n-type substrate) to be used. In addition, suppression of the parasitic capacitance is allowed regardless of the type of substrate used.

Thus, forming the well on the semiconductor substrate enables raising the voltage at which the inversion layer is generated and suppressing the signal leakage of the surface of the substrate.

In addition, it is known that an n-type semiconductor substrate also has the accumulation state, the depletion state, and the inversion state generated due to a gate voltage. Therefore, similar to the above, a parasitic capacitance is reduced by using the depletion state, while the carrier is not generated in the vicinity of the surface of the substrate. As such, signal leakage in a lateral direction is less likely to occur.

Next, detailed characteristics of the device when a MEMS is driven while having the depletion state below the fixed electrode thereof will be described. Here, an effect obtained in a case where the MEMS is applied to a MEMS resonator is explained as an example.

As described above, when the MEMS resonator is driven while a semiconductor substrate is in a depletion state, a value of a parasitic capacitance to be formed is reduced. Therefore, signals passing through that parasitic capacitance are reduced, resulting in a steep resonance peak.

Further, it is known that when an oscillation circuit is structured to be coupled with an active circuit, a parasitic capacitance included in the MEMS resonator is regarded as a parasitic capacitance equivalently included in a transistor, thereby reducing a negative resistance that can be generated by the transistor. Consequently, when the parasitic capacitance of the MEMS resonator decreases, a negative resistance value that can be generated by the transistor increases compared to ability of the transistor, thereby achieving a low-power-consumption circuit.

On the other hand, when a well is not formed, a bias voltage that can be applied to the MEMS resonator decreases. When a bias voltage of a threshold value or more is applied to the MEMS resonator, the substrate located below the fixed electrode of the MEMS is in the inversion state. Therefore, electrons as a few carriers are excited on a surface of the substrate, so that the signal easily flows in the lateral direction. Further, since a parasitic capacitance between the fixed electrode and the substrate increases in accordance with the above, the parasitic capacitance of the MEMS resonator increases equivalently. As a result, adverse effects such as that a resonance peak of the resonator loses steepness (degradation of Q value) arise.

It has been explained above that electric characteristics of the MEMS can be improved by using the substrate below the fixed electrode of the MEMS in a depletion state.

Hereinafter, embodiments of the invention will be described with reference to the accompanying drawings.

First Embodiment

Figure 1B:
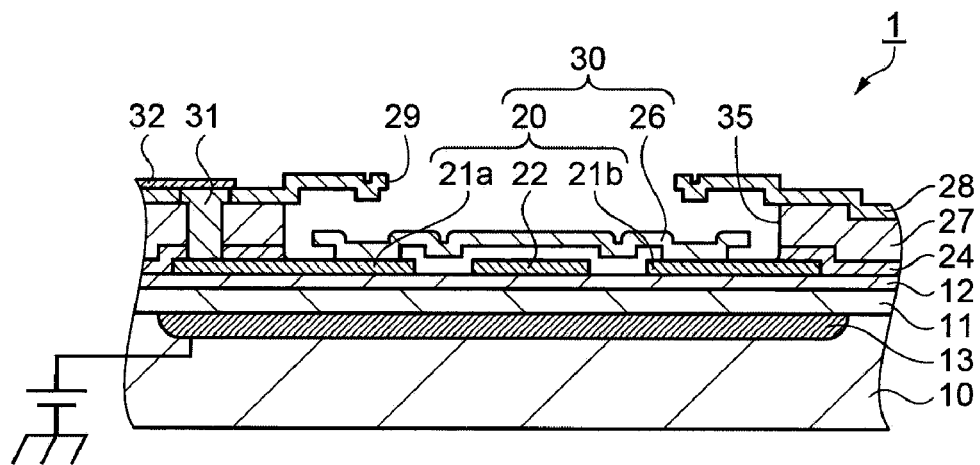

FIGS. 1A and 1B show a structure of a MEMS device according to a first embodiment. FIG. 1A is a schematic plan view of the MEMS device, while FIG. 1B is a partial schematic sectional view taken along line A-A of FIG. 1A.

A MEMS device 1 is provided with a MEMS 30, a wiring layer 27, and a passivation film 28 on a semiconductor substrate 10. The wiring layer 27 is formed to surround the MEMS 30, while the passivation film 28 extends from a top of the wiring layer 27 to above the MEMS 30, and includes an opening 29 formed therein.

The semiconductor substrate 10 is a p-type substrate made of silicon. On the semiconductor substrate 10, a silicon oxide film 11 is formed, and further a silicon nitride film 12 is formed on the silicon oxide film 11. Then, on the silicon nitride film 12, the MEMS 30 is provided. The MEMS 30 is made of polysilicon, and includes a fixed electrode 20 and a movable electrode 26. The fixed electrode 20 is disposed on the silicon nitride film 12, and provided with input electrodes 21a and 21b, and an output electrode 22. The movable electrode 26 is supported at both sides by portions rising from the input electrodes 21a and 21b so as to be held in the air.

An end of the input electrode 21a extends to the wiring layer 27 surrounding the MEMS, and is coupled to a wiring 31. The wiring layer 27 is made by laminating an insulating film such as a $SiO_2$ film. The wiring 31 going through the wiring 27 is coupled to an aluminum wiring 32 from a coupling pad formed on the wiring 31.

An end of the output electrode 22 extends to the wiring layer 27 surrounding the MEMS, and is coupled to a wiring 33, and further to an aluminum wiring 34 from a coupling pad formed on the wiring layer 27.

Under the wiring layer 27, an oxide film 24 such as a $SiO_2$ film is formed to be used as a sacrifice layer for when the MEMS is released by etching.

Further, the semiconductor substrate 10 below the input electrodes 21a and 21b, and the output electrode 22, which are the fixed electrodes of the MEMS 30 includes a p-type well 13 formed therein. The well 13 is formed in a region including the MEMS 30 in a plan view.

Further, the passivation film 28 is formed so as to extend from on the wiring layer 27 to above of the MEMS 30. The passivation film 28 includes the opening 29 formed therein. The MEMS 30 is released by etching the wiring layer 27 and the oxide film 24 from the opening 29, forming a cavity 35 to dispose the MEMS 30 between the passivation film 28 and the semiconductor substrate 10. Note that a fixed voltage is applied to the well 13.

In the MEMS device 1 having such a structure, when a direct-current voltage is applied to the movable electrode 26 through the input electrode 21a of the MEMS 30, a potential difference is generated between the movable electrode 26 and the output electrode 22, resulting in an electrostatic force acting between the movable electrode 26 and the output electrode 22. Here, when an alternating-current voltage is further applied to the movable electrode 26, the electrostatic force varies such as being bigger or smaller. Then, the movable electrode 26 oscillates to be closer or further from the output electrode 22. At this time, since transfer of charge occurs on a surface of the output electrode 22, an electric current flows into the output electrode 22. Then, the oscillation is repeated. As such, a specific resonance frequency signal is output from the output electrode 22. When the voltage applied to the MEMS 30 is equal to or less than an inversion voltage of the well, the well 13 should be grounded.

On the other hand, when the voltage applied to the MEMS 30 is equal to or more than the inversion voltage of the well described above, a voltage in which a depletion state can be maintained is applied to the well 13.

For example, when a driving voltage of the MEMS is 8 V and a potential in which an inversion layer is generated in the well 13 is 7 V, a potential difference between the well 13 and the MEMS 30 is 5 V by applying a voltage of 3 V to the well 13. Here, the well 13 of the semiconductor substrate 10 maintains a depletion state without generating the inversion layer. In this case, in the vicinity of the well 13, a well (n-type well) having an opposite polarity is arranged (not shown) as a guard ring, and used by applying a voltage whose absolute value is equal to or more than the voltage value applied to the well 13 and has the same polarity as the well 13. For example, when a voltage of 3V is applied to the well 13, a voltage of 5V is applied to the guard ring portion in the vicinity of the well 13 to be used.

Next, a method for manufacturing a MEMS device having the structure above will be explained.

Figure 2A:
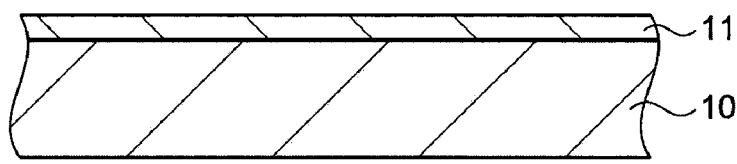
FIGS. 2A through 2D are partial sectional views schematically showing a process for manufacturing the MEMS device in the first embodiment.
Figure 2B:
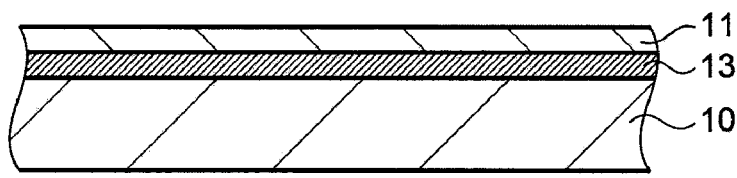
Figure 2C:
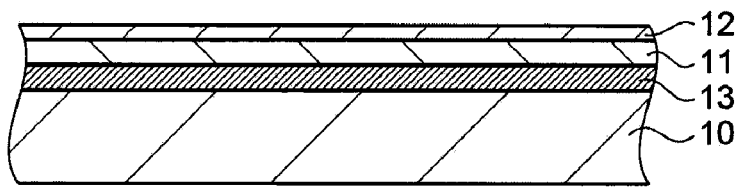
Figure 2D:
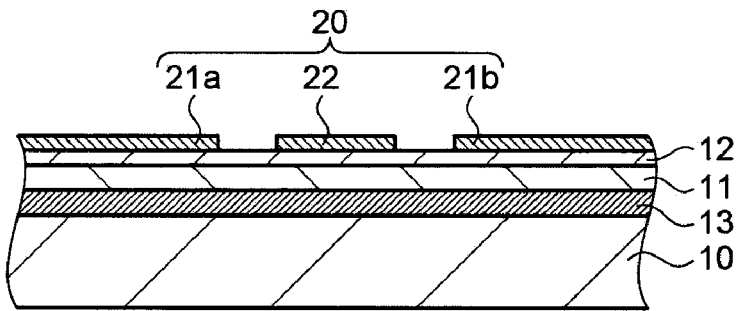

FIGS. 2A through 4C are partial sectional views schematically showing a process for manufacturing the MEMS device. First, as shown in FIG. 2A, the silicon oxide film 11 is formed on the semiconductor substrate 10 made of silicon by thermal oxidation. Next, as shown in FIG. 2B, boron (b) ions are implanted into a predetermined region of the semiconductor substrate 10 so as to form the well 13 that is a p-type well. Subsequently, as shown in FIG. 2C, the silicon nitride film 12 is formed on the silicon oxide film 11. Then, as shown in FIG. 2D, after a polysilicon film is formed on the silicon nitride film 12, the input electrodes 21a and 21b, and the output electrode 22, which are the fixed electrode 20 of the MEMS, are formed by patterning.

Figure 3A:
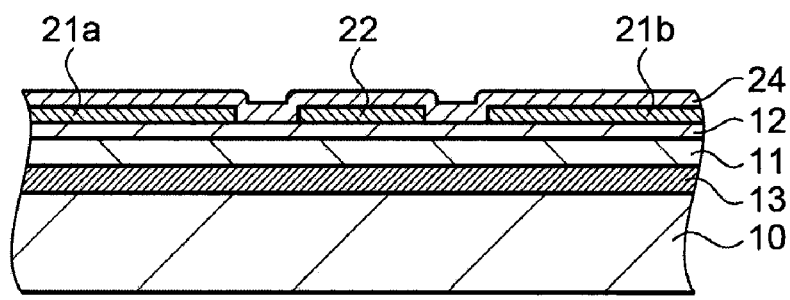
FIGS. 3A through 3D are partial sectional views schematically showing the process for manufacturing the MEMS device in the first embodiment.
Figure 3B:
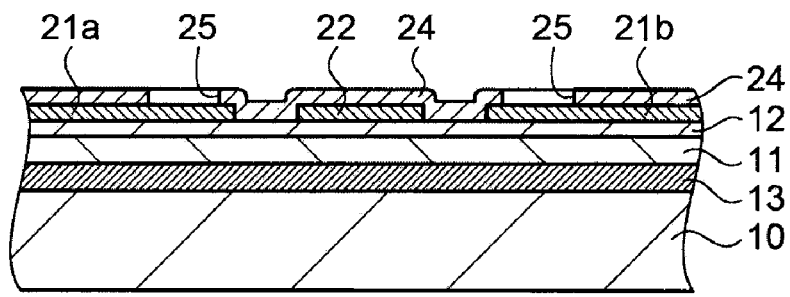
Figure 3C:
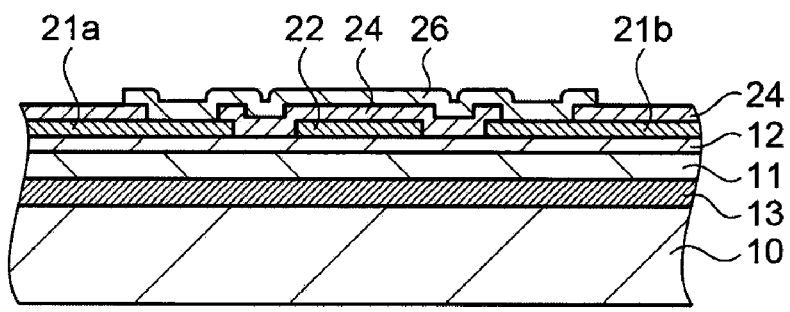
Figure 3D:
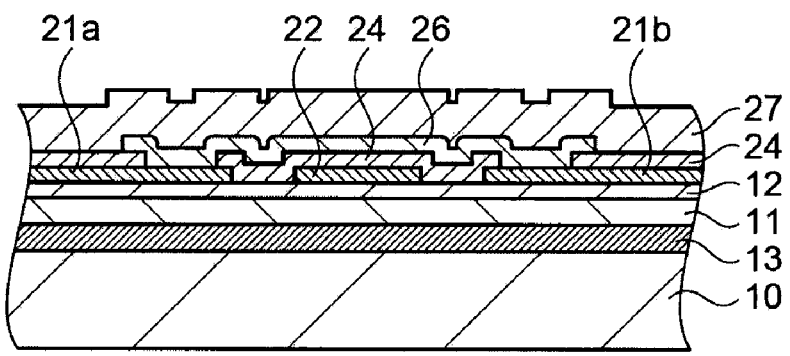

Next, as shown in FIG. 3A, the oxide film 24 such as a $SiO_2$ film is formed on the input electrodes 21a and 21b, and the output electrode 22. Next, as shown in FIG. 3B, an opening hole 25 is formed in the oxide film 24 on the input electrodes 21a and 21b. Subsequently, a polysilicon film is formed on the oxide film 24, and patterned. Then, as shown in FIG. 3C, the movable electrode 26 of the MEMS is formed by etching. Thereafter, as shown in FIG. 3D, the wiring layer 27 is formed with wiring (not shown) layered through an insulating film such as a $SiO_2$ film.

Figure 4A:
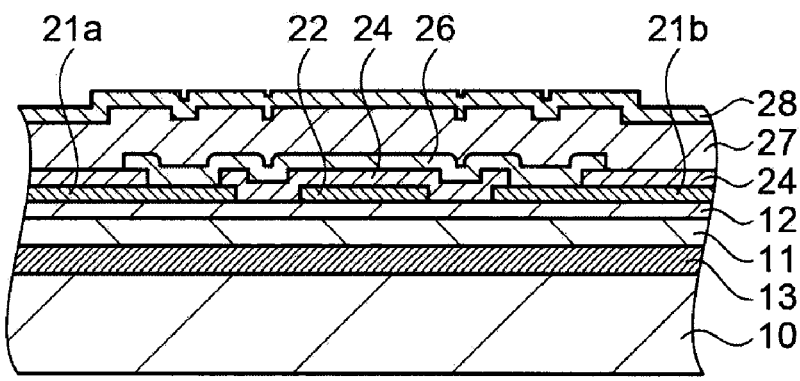
FIGS. 4A through 4C are partial sectional views schematically showing the process for manufacturing the MEMS device in the first embodiment.
Figure 4B:
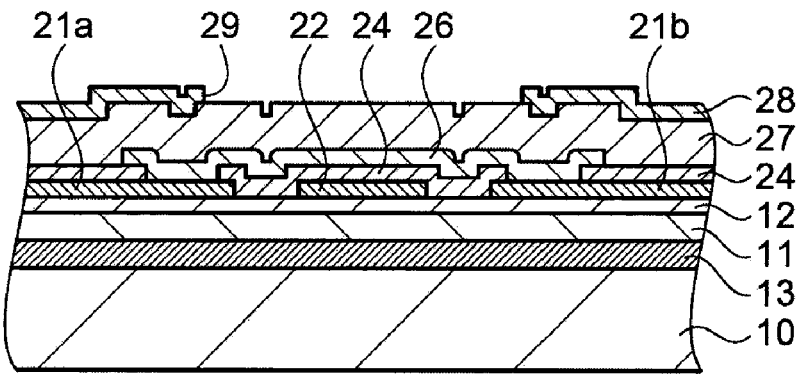

Next, as shown in FIG. 4A, the passivation film 28 is formed on the wiring layer 27. Subsequently, as shown in FIG. 4B, an opening 29 is formed in the passivation film 28 formed above the MEMS.

Figure 4C:
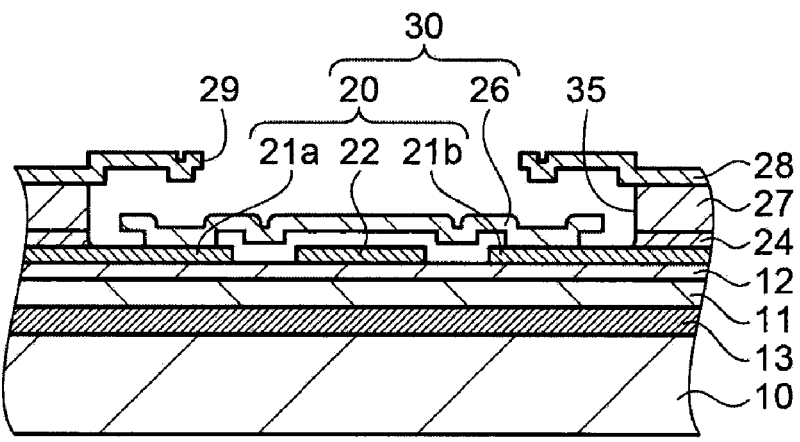

Then, as shown in FIG. 4C, the wiring layer 27 and the oxide film 24 are etched by an acid etchant applied through the opening 29, thereby releasing the MEMS 30. At this time, the cavity 35 is formed between the semiconductor substrate 10 and the passivation film 28. According to the foregoing, the MEMS device 1 shown in FIG. 1 is produced.

Accordingly, the MEMS device 1 of the first embodiment has the well 13 formed below the fixed electrode 20 of the MEMS 30, and a positive voltage is applied to the fixed electrode 20 of the MEMS 30. The well 13 is a p-type well. Further, a fixed voltage is applied to the well 13 formed in the semiconductor substrate 10 located below the fixed electrode 20 so that the well 13 is depleted.

Accordingly, forming the well 13 and applying a fixed voltage to the well 13 so as to be depleted makes the surface of the semiconductor be depleted. Since an apparent distance between the electrodes facing each other is increased due to a depletion layer, a parasitic capacitance at this portion is decreased. Therefore, a parasitic capacitance between the MEMS 30 and the semiconductor substrate 10 is reduced, so that leakage of a high frequency signal through the surface of the semiconductor substrate 10 is reduced, thereby stabilizing the characteristics of the MEMS device 1.

First Modification

Next, a first modification on the combination of polarities of the semiconductor substrate and the well in the first embodiment will be explained. In the first modification, the semiconductor substrate is a p-type substrate, while the well is an n-type well. Further, the semiconductor substrate includes a circuit element formed thereon, and a potential of the semiconductor substrate is set at a common potential, 0 V.

Figure 5:
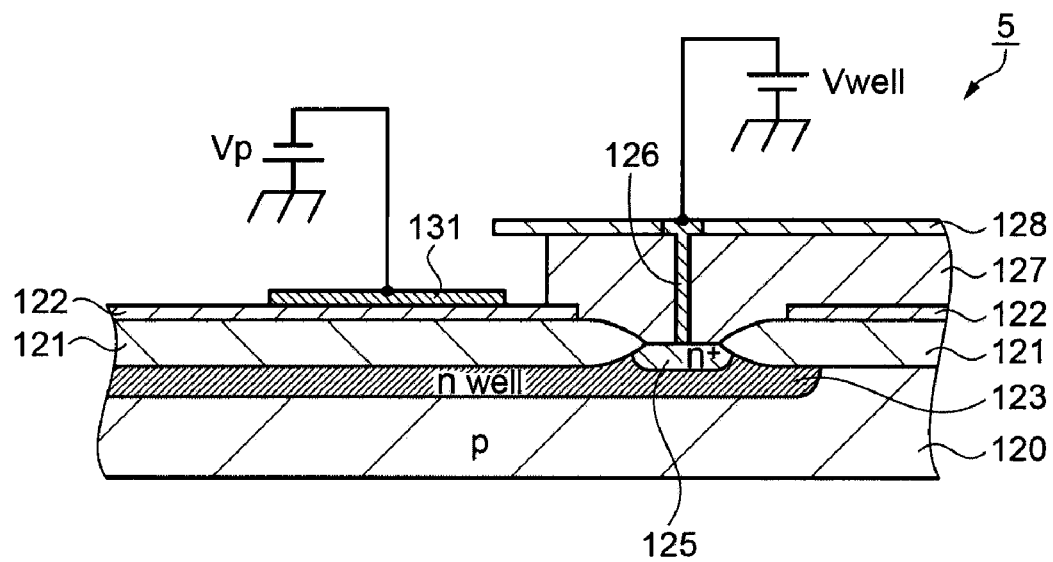
FIG. 5 is a partial sectional view schematically showing a structure of a MEMS device according to a first modification.

FIG. 5 is a partial sectional view schematically showing a MEMS device according to the first modification. A MEMS device 5 is provided with a MEMS (here, only an input electrode 131 in the form of a fixed electrode is shown and a movable electrode is omitted), a wiring layer 127, and a passivation film 128 on a semiconductor substrate 120. The wiring layer 127 is formed around the MEMS, while the passivation film 128 is formed on the wiring layer 127.

The semiconductor substrate 120 is a p-type substrate made of silicon. On the semiconductor substrate 120, a silicon oxide film 121 is formed, and further a silicon nitride film 122 is formed on the silicon oxide film 121. Then, on the silicon nitride film 122, a MEMS is provided. Since a structure of the MEMS is the same as that of the MEMS explained in FIG. 1, a detailed description is omitted here.

Further, the semiconductor substrate 120 below the input electrode 131, which is the fixed electrode of the MEMS, includes an n-type well 123 formed therein. The well 123 is formed in a region including the MEMS in a plan view.

Further, an electrode 125 is formed in a part of the well 123, and coupled to an upper surface of the passivation film 128 by a wiring 126 through the wiring layer 127.

A positive voltage is applied to the well 123 through the wiring 126. On the other hand, a negative voltage is applied to the input electrode 131 of the MEMS.

Here, a threshold voltage in which an inversion layer is generated in the well 123 is Vth, while a bias voltage applied to the MEMS is Vp, and a voltage applied to the well 123 below the MEMS is Vwell.

Figure 6:
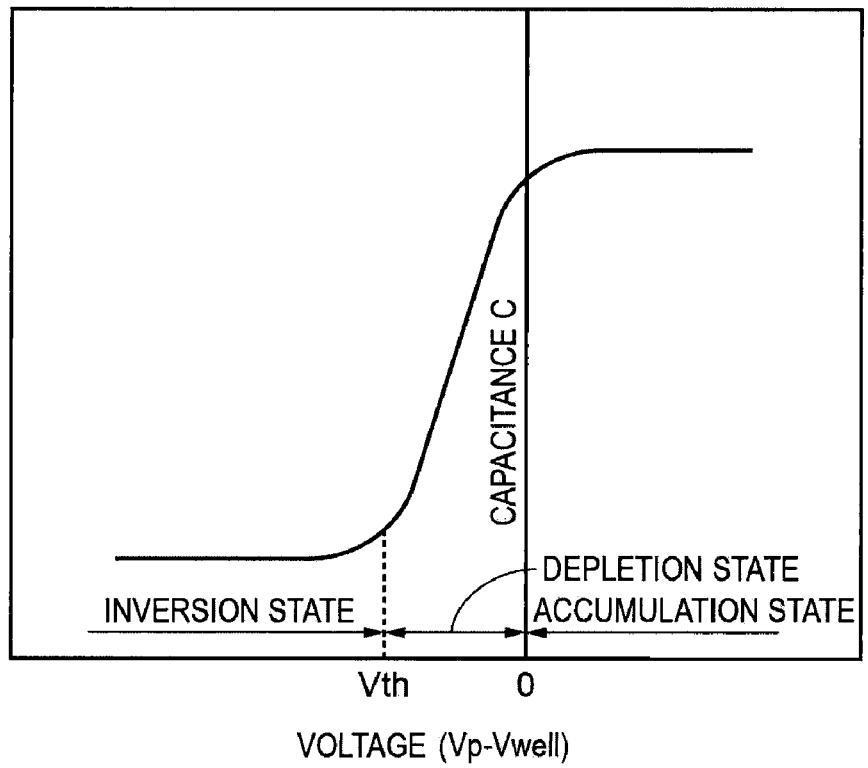
FIG. 6 is a graph showing a relation between a difference of Vp and Vwell (Vp−Vwell) and a capacitance C between a MEMS and a well in the first modification.

A relation between a difference between Vp and Vwell (Vp−Vwell) and a capacitance C between the MEMS and the well in the above state is shown by a graph in FIG. 6.

When the semiconductor substrate 120 is a p-type substrate, and the well 123 is an n-type well, the threshold voltage Vth is less than 0 (zero). When the voltage of Vp−Vwell is positive, the well is in an accumulation state. Therefore, a value of the capacitance C between the MEMS and the well is large which results in a large parasitic capacitance. A range of Vp−Vwell from the voltage of 0 (zero) to a threshold voltage Vth is a range in which the well is depleted. Therefore, the capacitance C between the MEMS and the well becomes small from 0 V toward the threshold voltage Vth, thereby the parasitic capacitance is also getting small. Further, when the capacitance C is smaller than the threshold voltage Vth, the well is in an inversion state. As described above, by using the well in a depletion state, the parasitic capacitance between the MEMS and the semiconductor substrate is decreased. In addition, signal leakage in a lateral direction in the vicinity of the substrate is less likely to occur.

In order to deplete the well, the conditions Vp<0, Vwell>0, and 0<|Vp−Vwell|<|Vth| should be satisfied.

By satisfying the above conditions, when the semiconductor substrate 120 is a p-type substrate and the well 123 is an n-type well, the well 123 formed in the semiconductor substrate below the fixed electrode is depleted. Then, due to a depletion layer generated in the well 123, an apparent distance between the electrodes facing each other is increased, thereby decreasing the parasitic capacitance in this portion. Therefore, the parasitic capacitance between the MEMS and the semiconductor substrate 120 can be reduced, so that leakage of a high frequency signal through the surface of the semiconductor substrate 120 is prevented, thereby stabilizing the characteristics of the MEMS device 5. Further, employing such a structure can facilitate the use of the MEMS by integrating it with a circuit such as an IC.

Second Modification

Next, another modification on the combination of polarities of the semiconductor substrate and the well in the first embodiment will be explained. In the second modification, the semiconductor substrate is an n-type substrate, and the well is a p-type well. Further, the semiconductor substrate includes a circuit element formed thereon, and a potential of the semiconductor substrate is set at a common potential, 0 V.

Figure 7:
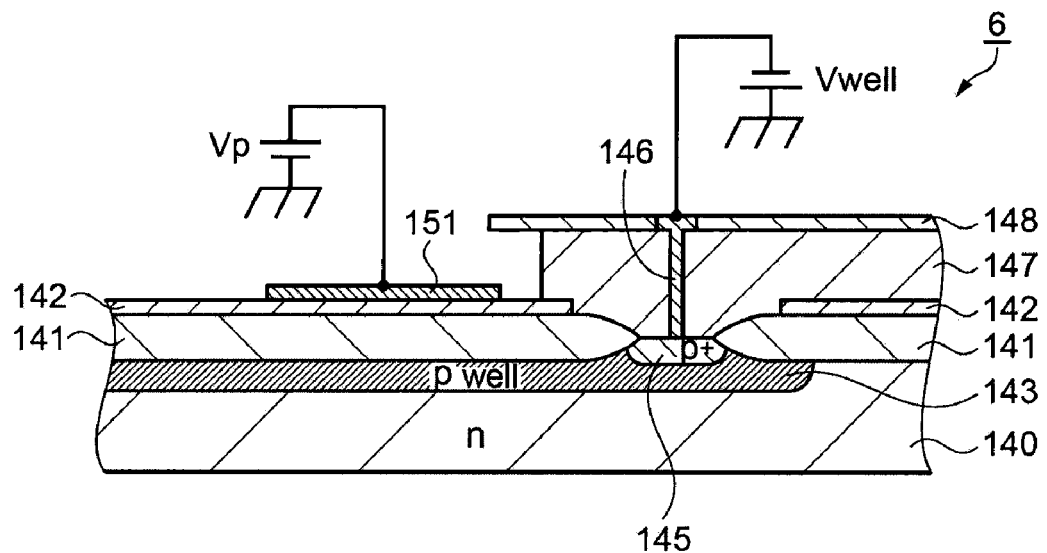
FIG. 7 is a partial sectional view schematically showing a MEMS device according to a second modification.

FIG. 7 is a partial sectional view schematically showing a MEMS device according to the second modification. A MEMS device 6 is provided with a MEMS (here, only an input electrode 151 in the form of a fixed electrode is shown, and a movable electrode is omitted), a wiring layer 147, and a passivation film 148 on a semiconductor substrate 140. The wiring layer 147 is formed around the MEMS, while the passivation film 148 is formed on the wiring layer 147.

The semiconductor substrate 140 is an n-type substrate made of silicon. On the semiconductor substrate 140, a silicon oxide film 141 is formed, and further a silicon nitride film 142 is formed on the silicon oxide film 141. Then, on the silicon nitride film 142, the MEMS is provided. Since the structure of the MEMS is the same as that of the MEMS explained in FIG. 1, a detailed description is omitted here.

Further, the semiconductor substrate 140 below the input electrode 151, which is the fixed electrode of the MEMS, includes a p-type well 143 formed therein. The well 143 is formed in a region including the MEMS in a plan view.

Further, an electrode 145 is formed in a part of the well 143, and coupled to an upper surface of the passivation film 148 by a wiring 146 through the wiring layer 147.

A negative voltage is applied to the well 143 through the wiring 146. On the other hand, a positive voltage is applied to the input electrode 151 of the MEMS.

Here, a threshold voltage in which an inversion layer is generated in the well 143 is Vth, while a bias voltage applied to the MEMS is Vp, and a voltage applied to the well 143 below the MEMS is Vwell.

Figure 8:
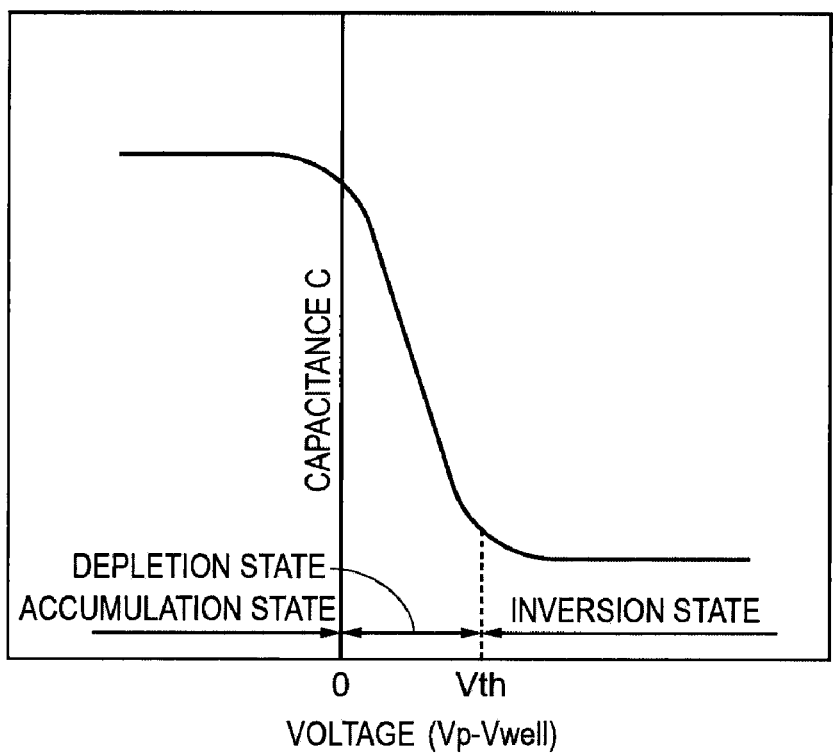
FIG. 8 is a graph showing a relation between a difference of Vp and Vwell (Vp−Vwell) and a capacitance C between a MEMS and a well in the second modification.

A relation between a difference between Vp and Vwell (Vp−Vwell) and the capacitance C between the MEMS and the well in the above state is shown by a graph in FIG. 8.

When the semiconductor substrate 140 is an n-type substrate, and the well 143 is a p-type well, the threshold voltage Vth is more than 0 (zero). When the voltage of Vp−Vwell is negative, the well is in an accumulation state. Therefore, a value of the capacitance C between the MEMS and the well is large, resulting in a large parasitic capacitance. A range of Vp−Vwell from the voltage of 0 (zero) to the threshold voltage Vth is a range in which the well is depleted. Therefore, the capacitance C between the MEMS and the well becomes small from 0 V toward the threshold voltage Vth, thereby the parasitic capacitance is also getting small. Further, when the capacitance C is larger than the threshold voltage Vth, the well is in an inversion state. As described above, by using the well in a depletion state, the parasitic capacitance between the MEMS and the semiconductor substrate is decreased. In addition, signal leakage in a lateral direction in the vicinity of the substrate is less likely to occur.

In order to deplete the well, the conditions of Vp>0, Vwell<0, and 0<|Vp−Vwell|<|Vth| should to be satisfied.

By satisfying the above conditions, when the semiconductor substrate 140 is an n-type substrate, and the well 143 is a p-type well, the well 143 formed in the semiconductor substrate 140 below the fixed electrode is depleted. Then, due to a depletion layer generated in the well 143, an apparent distance between the electrodes facing each other is increased, thereby decreasing the parasitic capacitance in this portion. Therefore, the parasitic capacitance between the MEMS and the semiconductor substrate 140 can be reduced, so that leakage of a high frequency signal through the surface of the semiconductor substrate 140 is prevented, thereby stabilizing the characteristics of the MEMS device 6. Further, employing such a structure can facilitate the use of the MEMS by integrating it with a circuit such as an IC.

Second Embodiment

Next, a MEMS device according to a second embodiment will be explained.

In the second embodiment, what differs from the first embodiment is that a well for an input electrode and a well for an output electrode are individually formed in a semiconductor substrate.

Figure 9A:
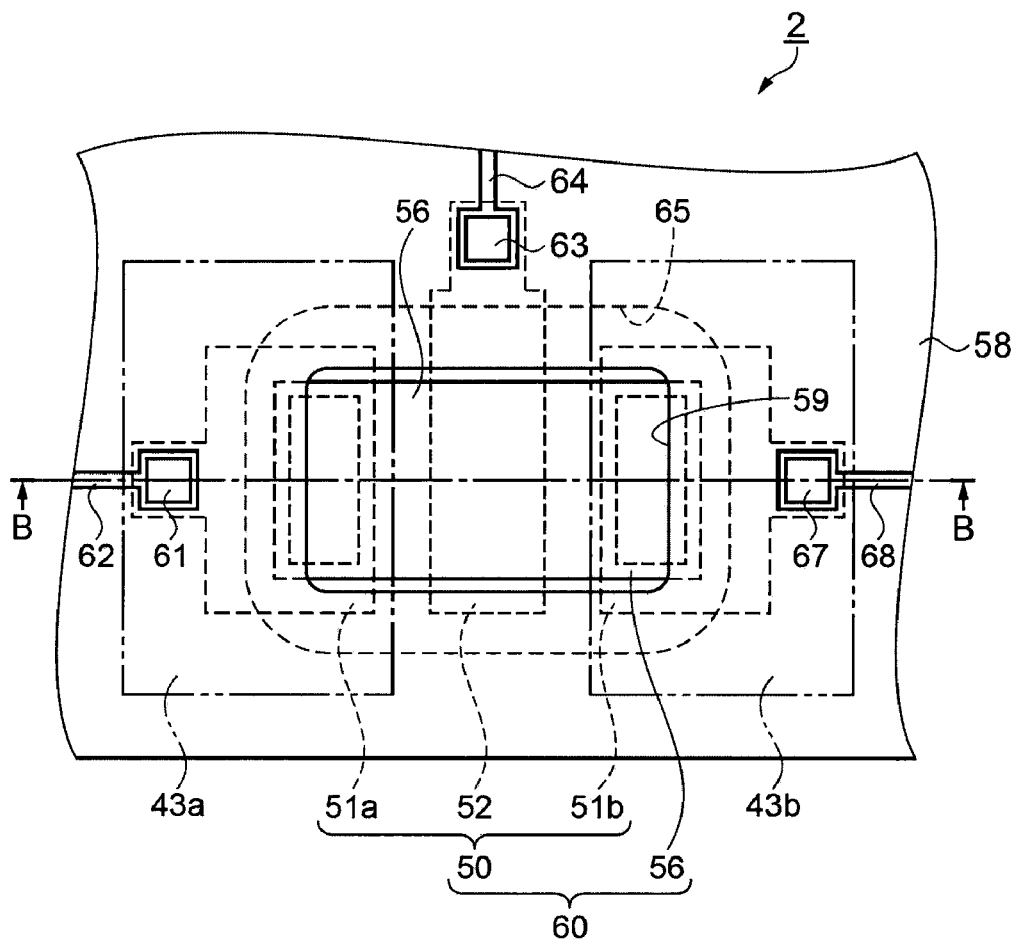
FIGS. 9A and 9B show a structure of a MEMS device according to a second embodiment.
Figure 9B:
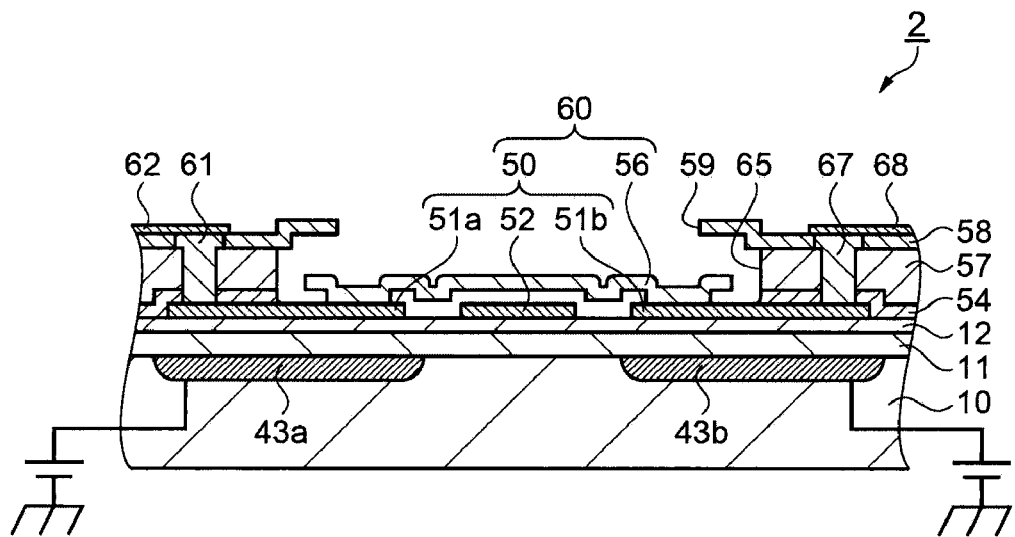

FIGS. 9A and 9B show a structure of the MEMS device according to the second embodiment. FIG. 9A is a schematic plan view of the MEMS device, while FIG. 9B is a partial schematic sectional view taken along line B-B of FIG. 9A. Here, like numerals indicate like elements in the first embodiment.

A MEMS device 2 is provided with a MEMS 60, a wiring layer 57, and a passivation film 58 on the semiconductor substrate 10. The wiring layer 57 is formed to surround the MEMS 60, while the passivation film 58 extends from a top of the wiring layer 57 to above the MEMS 60, and includes an opening 59 formed therein.

The semiconductor substrate 10 is a p-type substrate made of silicon. On the semiconductor substrate 10, the silicon oxide film 11 is formed, and further the silicon nitride film 12 is formed on the silicon oxide film 11. Then, on the silicon nitride film 12, the MEMS 60 is provided. The MEMS 60 is made of polysilicon, and includes a fixed electrode 50 and a movable electrode 56. The fixed electrode 50 is disposed on the silicon nitride film 12, and provided with input electrodes 51a and 51b, and an output electrode 52. The movable electrode 56 is supported at both sides by portions rising from the input electrodes 51a and 51b so as to be held in the air.

An end of the input electrode 51a extends to the wiring layer 57 surrounding the MEMS 60, and is coupled to a wiring 61. The wiring layer 57 is made by laminating an insulating film such as a SiO$_2$ film. The wiring 61 going through the wiring 57 is coupled to an aluminum wiring 62 from a coupling pad formed on the wiring 61.

Further, an end of the output electrode 52 extends to the wiring layer 57, and is coupled to a wiring 63. Furthermore, the output electrode 52 is coupled to an aluminum wiring 64 from a coupling pad formed on the wiring layer 57.

Under the wiring layer 57, an oxide film 54 such as a SiO$_2$ film is formed to be used as a sacrifice layer when the MEMS is released by etching.

Further, the semiconductor substrate 10 below the input electrodes 51a and 51b, which are the fixed electrode 50 of the MEMS 60, includes p-type wells 43a and 43b individually formed therein. Further, the passivation film 58 is formed so as to extend from on the wiring layer 57 to above the MEMS 60. The passivation film 58 includes the opening 59 formed therein. The MEMS 60 is released by etching the wiring layer 57 and the oxide film 54 from the opening 59, forming a cavity 65 to dispose the MEMS 60 between the passivation film 58 and the semiconductor substrate 10. Note that a fixed voltage is applied to each of the wells 43a and 43b.

In the MEMS device 2 having such a structure, when a direct-current voltage is applied to the movable electrode 56 through the input electrode 51a of the MEMS 60, a potential difference occurs between the movable electrode 56 and the output electrode 52, resulting in an electrostatic force acting between the movable electrode 56 and the output electrode 52. Here, when an alternating-current voltage is further applied to the movable electrode 56, the electrostatic force varies such as being bigger or smaller. Then, the movable electrode 56 oscillates to be closer or further from the output electrode 52. At this time, since transfer of charge occurs on a surface of the output electrode 52, an electric current flows into the output electrode 52. Then, the oscillation is repeated, thereby a specific resonance frequency signal is output from the output electrode 52. When the voltage applied to the MEMS 60 is equal to or less than an inversion voltage of the wells, the wells 43a and 43b should be grounded.

On the other hand, when the voltage applied to the MEMS 60 is equal to or more than the inversion voltage of the wells described above, a voltage in which a depletion state can be maintained is applied to the well 43a and the well 43b. For example, when a driving voltage of the MEMS 60 is 8 V and a potential in which an inversion layer is generated in the semiconductor substrate 10 is 7 V, a potential difference between the semiconductor substrate 10 and the MEMS 60 is 5 V by applying a voltage of 3 V to the wells 43a and 43b. In this case, the wells 43a and 43b of the semiconductor substrate 10 maintain a depletion state without generating the inversion layer.

In this case, in the vicinity of the wells 43a and 43b, a well having an opposite polarity is arranged (not shown) as a guard ring, and used by applying a voltage whose absolute value is equal to or more than a voltage value applied to the well 13 and has the same polarity as the wells 43a and 43b. For example, when a voltage of 3 V is applied to the wells 43a and 43b, a voltage of 5 V is applied to a guard ring portion in the vicinity to be used.

Next, a method for manufacturing a MEMS resonator having the structure above will be explained.

FIGS. 10A through 12C are partial sectional views schematically showing a process for manufacturing the MEMS device.

Figure 10A:
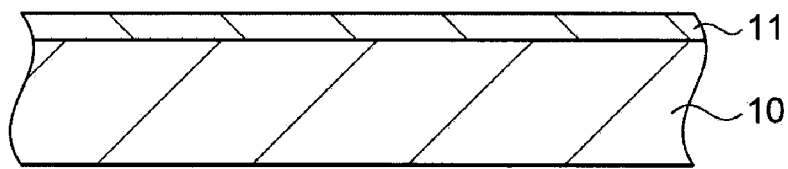
FIGS. 10A through 10D are partial sectional views schematically showing a process for manufacturing the MEMS device in the second embodiment.
Figure 10B:
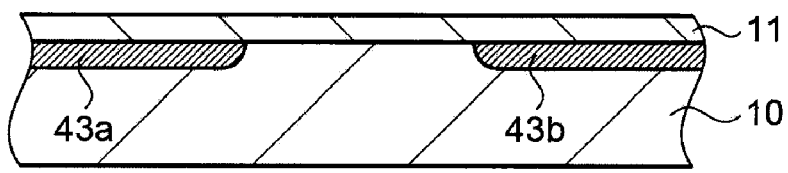
Figure 10C:
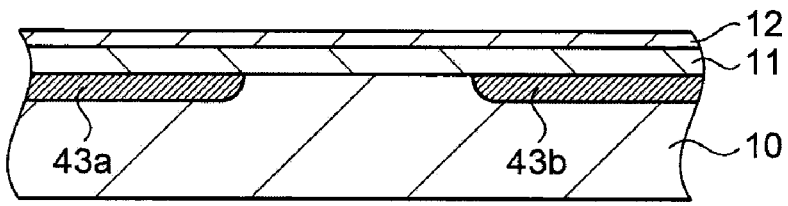
Figure 10D:
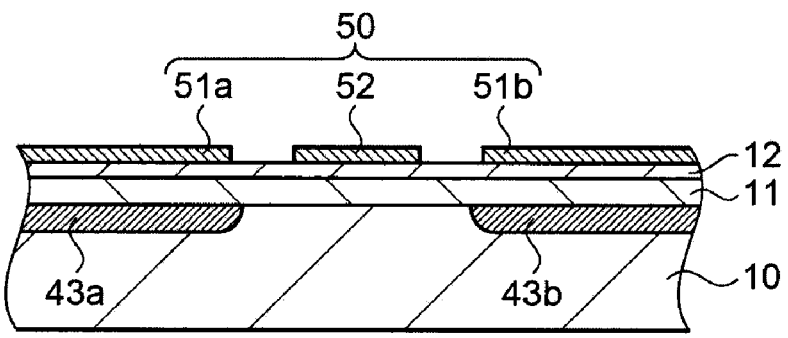

First, as shown in FIG. 10A, the silicon oxide film 11 is formed on the semiconductor substrate 10 made of silicon by thermal oxidation. Next, as shown in FIG. 10B, boron (B) ions are implanted into a predetermined region of the semiconductor substrate 10 so as to form the wells 43a and 43b that are p-type wells. Subsequently, as shown in FIG. 10C, the silicon nitride film 12 is formed on the silicon oxide film 11. Then, as shown in FIG. 10D, after a polysilicon film is formed on the silicon nitride film 12, the input electrodes 51a and 51b, and the output electrode 52, which are the fixed electrode 50 of the MEMS, are formed by patterning.

Figure 11A:
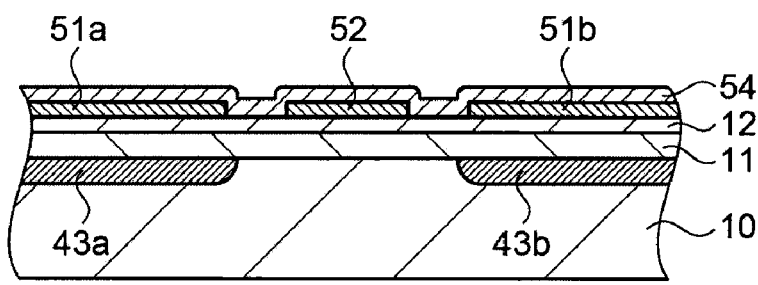
FIGS. 11A through 11D are partial sectional views schematically showing the process for manufacturing the MEMS device in the second embodiment.
Figure 11B:
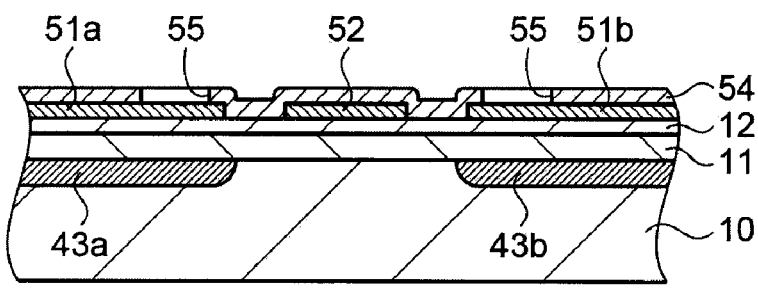
Figure 11C:
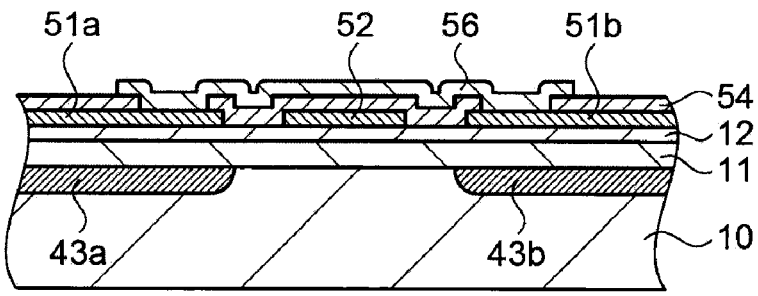
Figure 11D:
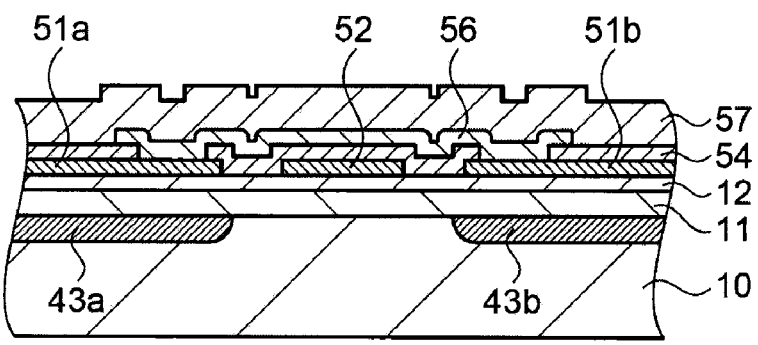

Next, as shown in FIG. 11A, the oxide film 54 such as a SiO$_2$ film is formed on the input electrodes 51a and 51b, and the output electrode 52. Afterwards, as shown in FIG. 11B, an opening hole 55 is formed in the oxide film 54 on the input electrodes 51a and 51b. Subsequently, a polysilicon film is formed on the oxide film 54, and patterned. Then, as shown in FIG. 11C, the movable electrode 56 of the MEMS is formed by etching. Further, as shown in FIG. 11D, the wiring layer 57 formed by wiring (not shown) layered through an insulating film such as a SiO$_2$ film.

Figure 12A:
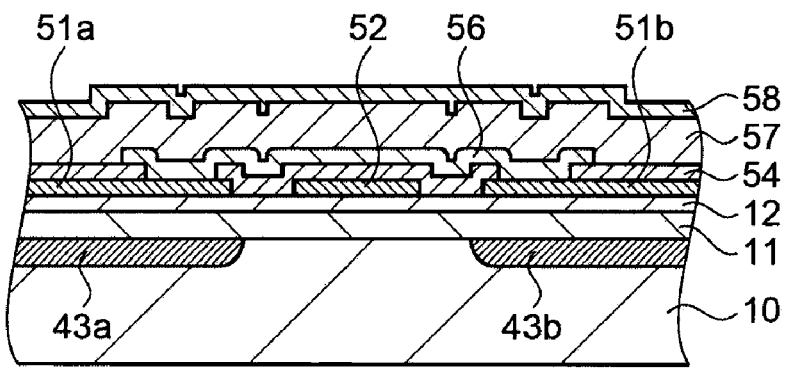
FIGS. 12A through 12C are partial sectional views schematically showing the process for manufacturing the MEMS device in the second embodiment.
Figure 12B:
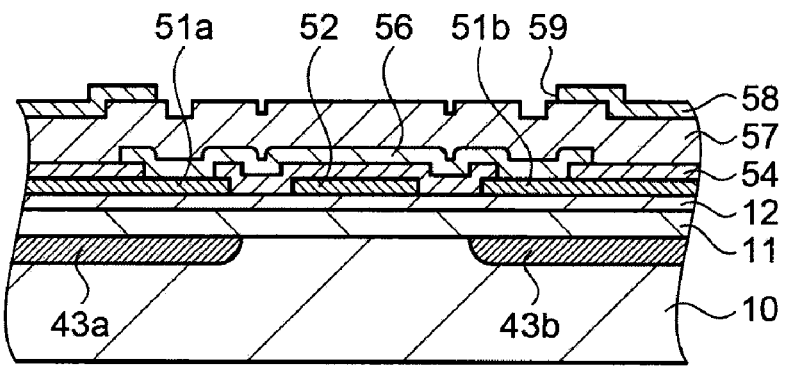

Next, as shown in FIG. 12A, the passivation film 58 is formed on the wiring layer 57. Subsequently, as shown in FIG. 12B, the opening 59 is formed in the passivation film 58 formed above the MEMS.

Figure 12C:
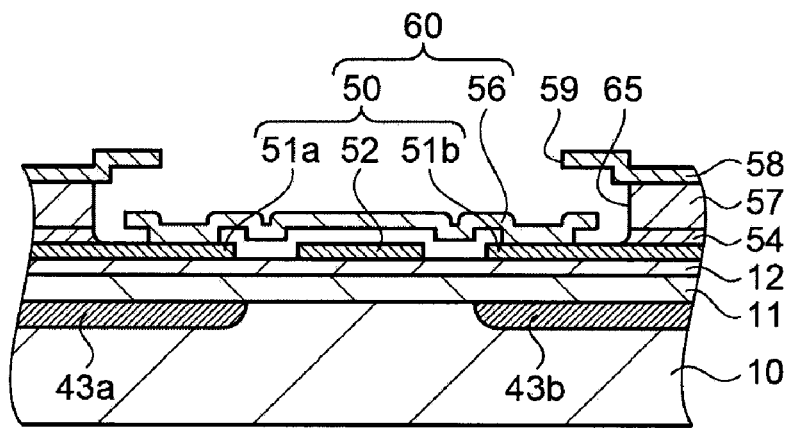

Then, as shown in FIG. 12C, the wiring layer 57 and the oxide film 54 are etched by coming in contact with an acid etchant through the opening 59, thereby releasing the MEMS 60. At this time, the cavity 65 is formed between the semiconductor substrate 10 and the passivation film 58. According to the above, the MEMS device 2 as shown in FIG. 9 is produced.

Accordingly, the MEMS device 2 of the second embodiment includes the wells 43a and 43b formed below the fixed electrode 50 of the MEMS 60. To the fixed electrode 50 of the MEMS 60, a positive voltage is applied. The wells 43a and 43b are p-type wells. Further, a fixed voltage is applied to the wells 43a and 43b formed in the semiconductor substrate 10 located below the fixed electrode 50 so that the wells 43a and 43b are depleted.

Accordingly, forming the wells 43a and 43b and applying a fixed voltage to the wells 43a and 43b so as to deplete them makes the surface of the semiconductor be depleted. Since an apparent distance between the electrodes facing each other is increased due to a depletion layer, a parasitic capacitance at this portion is decreased. Therefore, the parasitic capacitance between the MEMS 60 and the semiconductor substrate 10 is reduced, so that leakage of a high frequency signal through the surface of the semiconductor substrate 10 is reduced, thereby stabilizing the characteristics of the MEMS device 2.

Further, in the second embodiment, since each structure of the substrate below the input electrode and the output electrode of the MEMS is individually formed, signal leakage in a lateral direction of the substrate can be further reduced. As a result, an insulating property between the input electrodes 51a and 51b, and the output electrode 52 is further improved, thereby stabilizing the characteristics of the MEMS device 2.

Third Embodiment

Next, a MEMS device according to a third embodiment will be explained.

In the third embodiment, what differs from the first embodiment and the second embodiment is a structure of a well to be formed in a semiconductor substrate. However, the MEMS is similarly structured to that of the second embodiment.

Figure 13A:
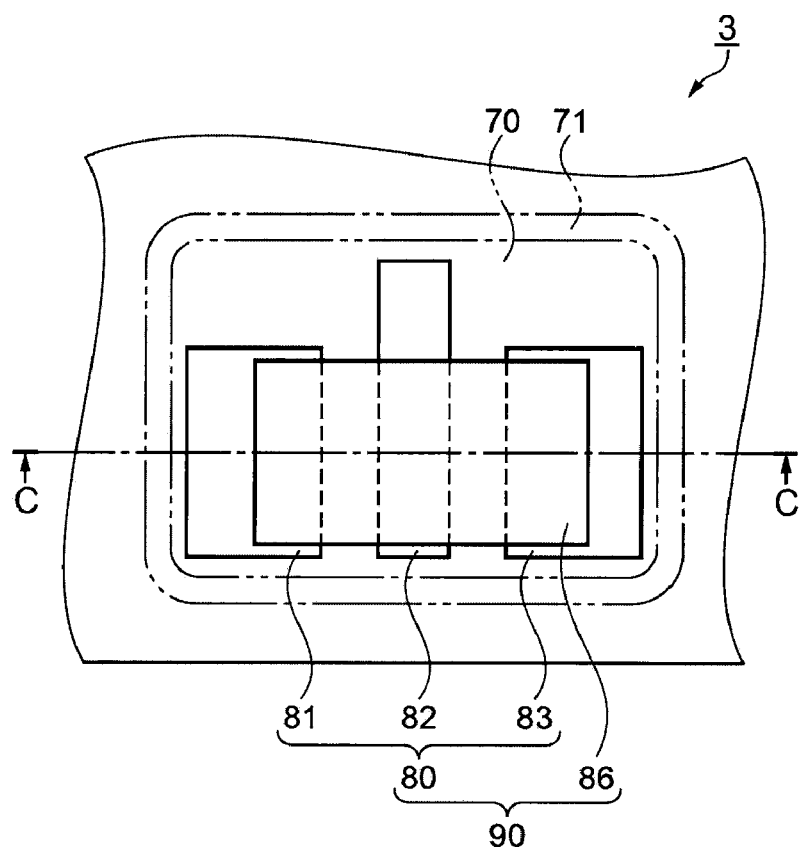
FIGS. 13A and 13B show a structure of a MEMS device according to a third embodiment.
Figure 13B:
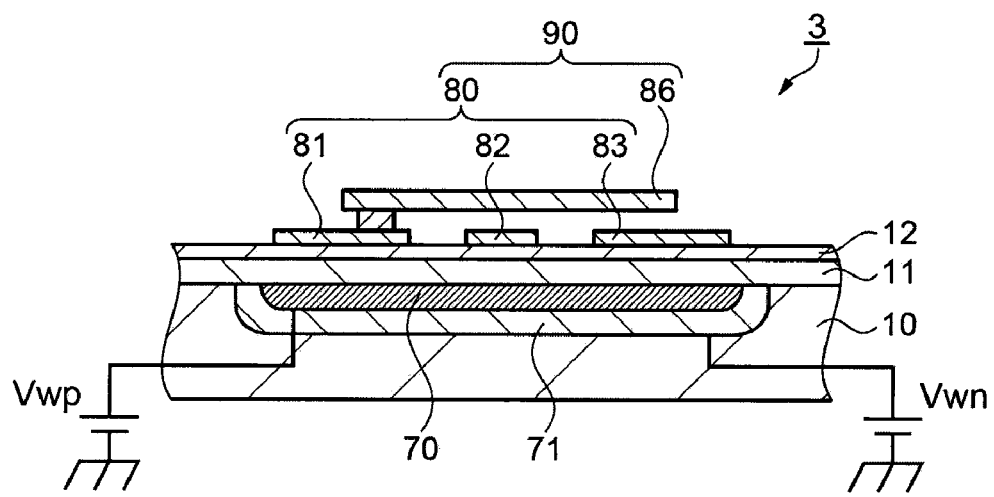

FIGS. 13A and 13B show a structure of the MEMS device according to the third embodiment. FIG. 13A is a schematic plan view of the MEMS device, while FIG. 13B is a partial schematic sectional view taken along a line C-C of FIG. 13A. Here, like numerals indicate like elements in the first embodiment. Note that, in these figures, only features that are distinguishing are schematically shown. The wiring layer surrounding the MEMS and the like described in the embodiments above are thus omitted.

A MEMS device 3 is provided with a MEMS 90 composed of a fixed electrode 80 and a movable electrode 86 on the semiconductor substrate 10.

The semiconductor substrate 10 is a p-type substrate made of silicon. On the semiconductor substrate 10, the silicon oxide film 11 is formed, and further the silicon nitride film 12 is formed on the silicon oxide film 11. Then, on the silicon nitride film 12, the MEMS 90 is provided. The MEMS 90 is made of polysilicon, and includes the fixed electrode 80 and the movable electrode 86. The fixed electrode 80 is disposed on the silicon nitride film 12, and provided with an input electrode 81, a driving electrode 82, and an output electrode 83. The movable electrode 86 is supported at one side by a portion rising from the input electrode 81 so as to be held in the air.

Further, the semiconductor substrate 10 below the input electrode 81, the driving electrode 82, and the output electrode 83, which compose the fixed electrode 80 in the MEMS 90 includes a p-type well 70 having the same polarity as that of the semiconductor substrate 10 formed therein. Further, an n-type isolation well 71 having a polarity opposite to that of the well 70 is formed to surround the well 70. The well 70 and the isolation well 71 are formed in a region including the MEMS 90 in a plan view.

A fixed voltage Vwp is applied to the well 70, while a fixed voltage Vwn is applied to the isolation well 71 so that a relation between them is Vwp<Vwn.

At this time, the voltage applied to the well 70 is a voltage that the well can maintain a depletion state. For example, when a driving voltage of the MEMS 90 is 10 V and a potential in which an inversion layer is generated in the semiconductor substrate 10 is 7 V, a potential difference between the well 70 and the MEMS 90 is 5 V by applying a voltage of Vwp=5V to the well 70. In this case, the well 70 of the semiconductor substrate 10 maintains the depletion state without generating the inversion layer. Further, a voltage of Vwn=6V is applied to the isolation well 71, while a voltage to be a reverse bias is applied to the n-type well or the p-type well adjacent to the isolation well 71.

Accordingly, the MEMS device 3 of the third embodiment has the well 70 that is a p-type well and formed below the fixed electrode 80 of the MEMS 90, and a positive voltage is applied to the fixed electrode 80 of the MEMS 90. Further, a fixed voltage is applied to the well 70 located below the fixed electrode 80 in the semiconductor substrate 10 so that the well 70 is depleted.

Since a surface of the well 70 becomes in the depletion state, an apparent distance between the electrodes facing each other is increased due to the depletion layer, decreasing a parasitic capacitance in this portion. Therefore, the parasitic capacitance between the MEMS 90 and the semiconductor substrate 10 can be reduced, so that leakage of a high frequency signal through the surface of the semiconductor substrate 10 is prevented, thereby stabilizing the characteristics of the MEMS device 3.

Further, the isolation well 71 surrounding the well 70 is formed so that the voltage applied to the isolation well 71 is higher than the voltage applied to the well 70. Accordingly, when the movable electrode 86 of the MEMS 90 is driven with a higher voltage, a potential in a portion where the MEMS 90 is formed is isolated from others without a current flow from the well 70 to the isolation well 71. Further, employing such a structure can facilitate providing a device including the MEMS 90 integrated with a circuit such as an IC.

Third Modification

Next, a third modification of the third embodiment will be explained. In the third embodiment, a semiconductor substrate is a p-type substrate, and a well is a p-type well, while an isolation well is an n-type well. A voltage is not applied to the isolation well. Further, the semiconductor substrate includes a circuit element formed thereon, and a potential of the semiconductor substrate is set at a common potential, 0 V.

Figure 14:
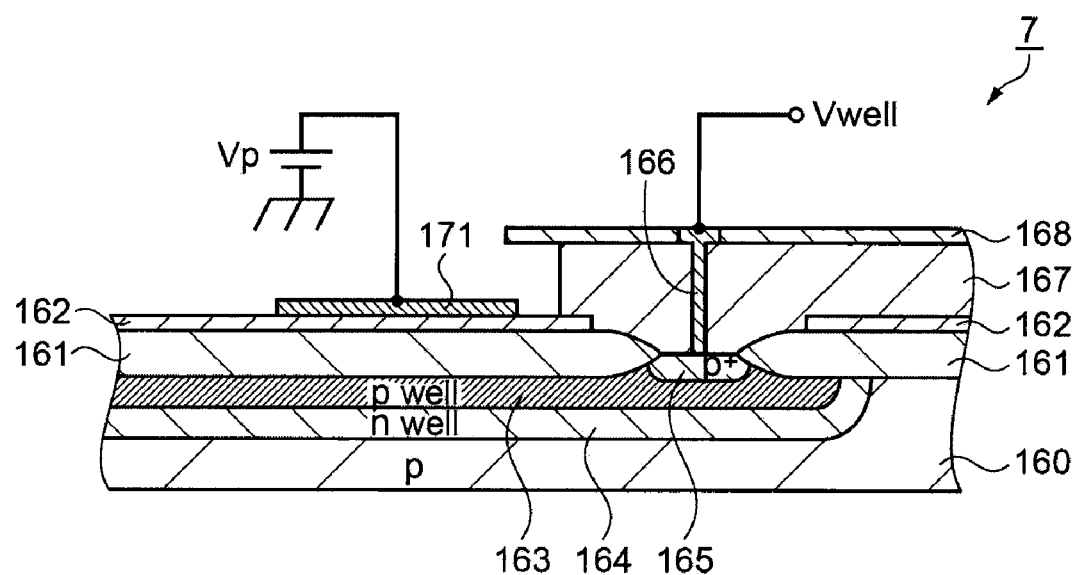
FIG. 14 is a partial sectional view schematically showing a MEMS device according to a third modification.

FIG. 14 is a partial sectional view schematically showing a MEMS device according to the third modification. A MEMS device 7 is provided with a MEMS (here, only an input electrode 171 in the form of a fixed electrode is shown, and a movable electrode is omitted), a wiring layer 167, and a passivation film 168 on a semiconductor substrate 160. The wiring layer 167 is formed around the MEMS, while the passivation film 168 is formed on the wiring layer 167.

The semiconductor substrate 160 is a p-type substrate made of silicon. On the semiconductor substrate 160, a silicon oxide film 161 is formed, and further a silicon nitride film 162 is formed on the silicon oxide film 161. Then, on the silicon nitride film 162, the MEMS is provided. Since a structure of the MEMS is the same as that of the MEMS explained in FIG. 1, a detailed description is omitted here.

The semiconductor substrate 160 below the input electrode 171, which is the fixed electrode of the MEMS, includes a p-type well 163 having the same polarity as that of the semiconductor substrate 160 and being formed therein. The well 163 is formed in a region including the MEMS in a plan view. Further, an n-type isolation well 164 having a polarity opposite to that of the well 163 is formed in the semiconductor substrate 160 so as to surround the well 163. Furthermore, a positive voltage is applied to the input electrode 171 of the MEMS.

An electrode 165 is formed in a part of the well 163, and coupled to an upper surface of the passivation film 168 by a wiring 166 through the wiring layer 167. Applying a positive or negative voltage to the electrode 165 makes the isolation well 164 and the semiconductor substrate 160 be in a reverse bias state.

Here, a threshold voltage in which an inversion layer is generated in the well 163 is Vth, while a bias voltage applied to the MEMS is Vp, and a voltage applied to the well 163 below the MEMS is Vwell.

A relation between a difference between Vp and Vwell (Vp−Vwell) and the capacitance C between the MEMS and the well in the above state is the same as the relation shown by the graph in FIG. 8.

Therefore, when the semiconductor substrate 160 is a p-type substrate, and the well 163 is a p-type well, while the isolation well 164 is an n-type well, the threshold voltage Vth is more than 0 (zero).

When the voltage of Vp−Vwell is negative, the well is in an accumulation state. Therefore, a value of the capacitance C between the MEMS and the well is large, resulting in a large parasitic capacitance. A range of Vp−Vwell from the voltage of 0 (zero) to the threshold Vth is a range in which the well is depleted. Therefore, the capacitance C between the MEMS and the well becomes gradually small from 0 V toward the threshold Vth, thereby the parasitic capacitance is also getting small. Further, when the capacitance C is larger than the threshold voltage Vth, the well is in an inversion state. As described above, by using the well in a depletion state, the parasitic capacitance between the MEMS and the semiconductor substrate is decreased. In addition, signal leakage in a lateral direction in the vicinity of the substrate is less likely to occur.

To deplete the well, the conditions of Vp>0, and 0<Vp−Vwell<Vth need to be satisfied. In this case, Vwell can be either a positive voltage or a negative voltage as long as the value satisfies the above conditions.

By satisfying the above conditions, when the semiconductor substrate 160 is a p-type substrate, the well 163 is a p-type well, and the isolation well 164 is an n-type well, the well 163 formed in the semiconductor substrate 160 below the fixed electrode is in the depletion state. Then, due to the depletion layer generated in the well 163, an apparent distance between the electrodes facing each other is increased, thereby decreasing a parasitic capacitance in this portion. Therefore, the parasitic capacitance between the MEMS and the semiconductor substrate 160 can be reduced, so that leakage of a high frequency signal through the surface of the semiconductor substrate 160 is prevented, thereby stabilizing the characteristics of the MEMS device 7. Further, employing such a structure can facilitate the use of the MEMS by integrating it with a circuit such as an IC since a potential of the well does not affect a potential of the semiconductor substrate.

Fourth Modification

Next, another modification on the combination of polarities of the semiconductor substrate and the well in the third embodiment will be explained. In a fourth modification, the semiconductor substrate is an n-type substrate, the well is an n-type well, and the isolation well is a p-type well. Further, the semiconductor substrate includes a circuit element formed thereon, and a potential of the semiconductor substrate is set at a common potential, 0 V.

Figure 15:
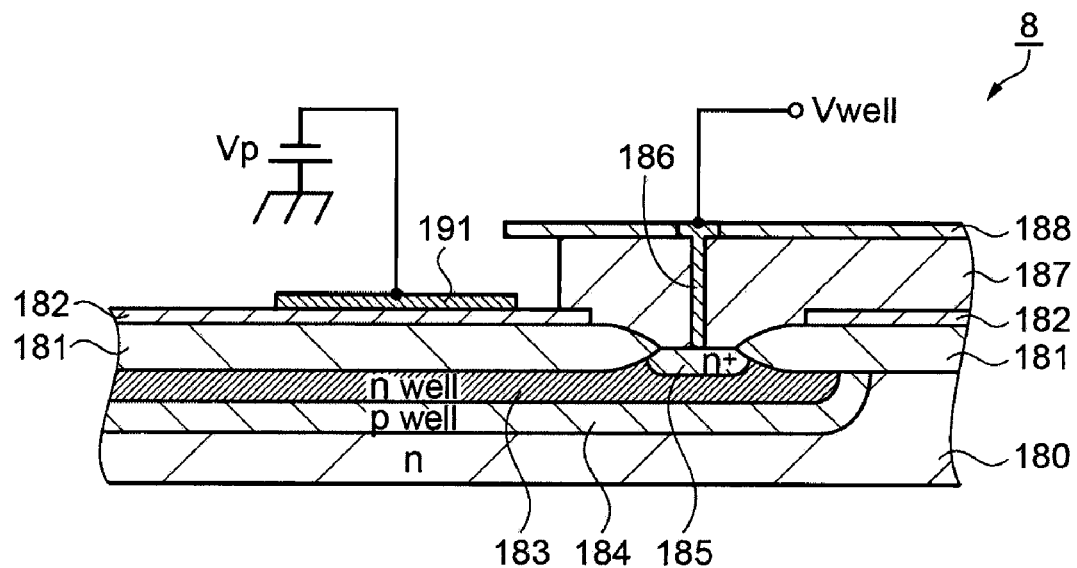
FIG. 15 is a partial sectional view schematically showing a MEMS device according to a fourth modification.
Figure 16:
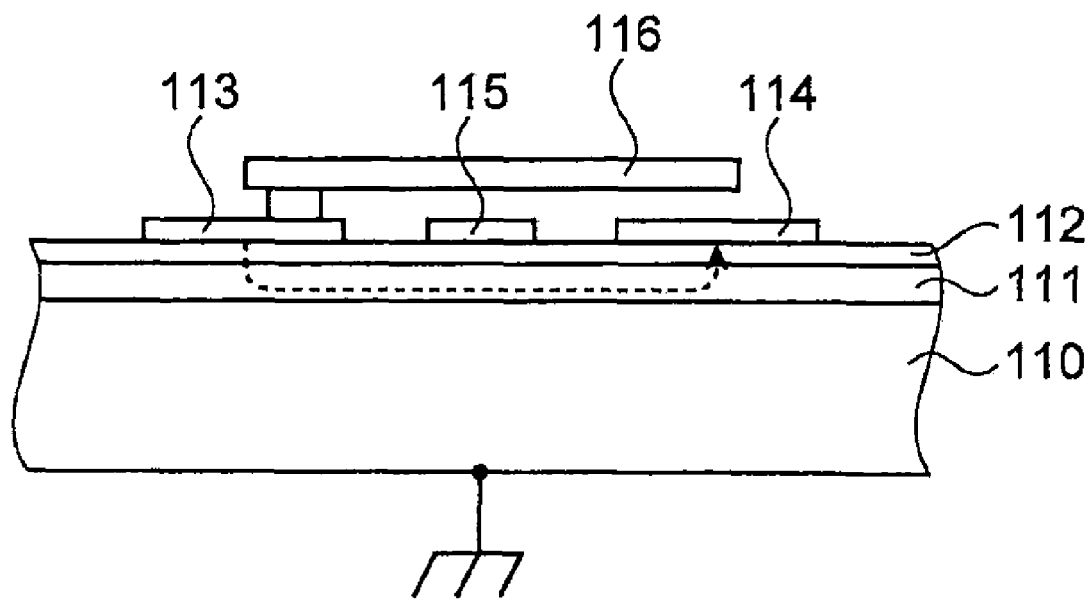
FIG. 16 is a diagram explaining a state of signal leakage occurring to a conventional MEMS device.

FIG. 15 is a partial sectional view schematically showing a MEMS device according to the fourth modification. A MEMS device 8 is provided with a MEMS (here, only an input electrode 191 in the form of a fixed electrode is shown, and a movable electrode is omitted), a wiring layer 187, and a passivation film 188 on a semiconductor substrate 180. The wiring layer 187 is formed around the MEMS, while the passivation film 188 is formed on the wiring layer 187.

The semiconductor substrate 180 is an n-type substrate made of silicon. On the semiconductor substrate 180, a silicon oxide film 181 is formed, and further a silicon nitride film 182 is formed on the silicon oxide film 181. Then, on the silicon nitride film 182, the MEMS is provided. Since the structure of the MEMS is the same as that of the MEMS explained in FIG. 1, a detailed description is omitted here.

The semiconductor substrate 180 below the input electrode 191 of the MEMS, includes an n-type well 183 having the same polarity as that of the semiconductor substrate 180 and being formed therein. The well 183 is formed in a region including the MEMS in a plan view. Further, a p-type isolation well 184 having a polarity opposite to that of the well 183 is formed so as to surround the well 183. Furthermore, a negative voltage is applied to the input electrode 191 of the MEMS.

An electrode 185 is formed in a part of the well 183, and coupled to an upper surface of the passivation film 188 by a wiring 186 through the wiring layer 187. Applying a negative or positive voltage to the electrode 185 makes the isolation well 184 and the semiconductor substrate 180 be in a reverse bias state.

Here, a threshold voltage in which an inversion layer is generated in the well 183 is Vth, while a bias voltage applied to the MEMS is Vp, and a voltage applied to the well 183 below the MEMS is Vwell.

A relation between a difference between Vp and Vwell (Vp−Vwell) and the capacitance C between the MEMS and the well in the above state is the same as the relation shown by the graph in FIG. 6.

Therefore, when the semiconductor substrate 180 is an n-type substrate, the well 183 is an n-type well, and the isolation well 184 is a p-type well, the threshold voltage Vth is less than 0 (zero).

When the voltage of Vp−Vwell is positive, the well is in an accumulation state. Therefore, a value of the capacitance C between the MEMS and the well is large, resulting in a large parasitic capacitance. A range of Vp−Vwell from the voltage of 0 (zero) to a threshold Vth is a range in which the well is depleted. Therefore, the capacitance C between the MEMS and the well becomes small from 0 V toward the threshold Vth, thereby the parasitic capacitance is also getting small. Further, when the capacitance C is smaller than the threshold voltage Vth, the well is in an inversion state. As described above, by using the well in a depletion state, the parasitic capacitance between the MEMS and the semiconductor substrate is decreased. In addition, signal leakage in a lateral direction in the vicinity of the substrate is less likely to occur.

To deplete the well, the conditions of Vp<0, and 0<Vp−Vwell<Vth should be satisfied. In this case, Vwell can be either a positive voltage or a negative voltage as long as the value satisfies the above conditions.

By satisfying the above conditions, when the semiconductor substrate 180 is an n-type substrate, the well 183 is an n-type well, and the isolation well 184 is a p-type well, the well 183 formed in the semiconductor substrate 180 below the fixed electrode is in the depletion state. Then, due to the depletion layer generated in the well 183, an apparent distance between the electrodes facing each other is increased, thereby decreasing a parasitic capacitance in this portion. Therefore, the parasitic capacitance between the MEMS and the semiconductor substrate 180 can be reduced, so that leakage of a high frequency signal through the surface of the semiconductor substrate 180 is prevented, thereby stabilizing the characteristics of the MEMS device 8. Further, employing such a structure can facilitate the use of the MEMS by integrating it with a circuit such as an IC since a potential of the well does not affect a potential of the semiconductor substrate.

What is claimed is:

1. A microelectromechanical system (MEMS) device, comprising:
   a semiconductor substrate;
   a MEMS including a first fixed electrode and a movable electrode, the first fixed electrode and the movable electrode being formed on an insulating layer that is adjacent to the semiconductor substrate; and
   a well formed on the semiconductor substrate below the first fixed electrode and in contact with the insulating layer, the well being one of an n-type well and a p-type well, wherein the p-type well is formed in a case of applying positive voltage to the fixed electrode while the n-type well is formed in a case of applying negative voltage to the fixed electrode,
   wherein the movable electrode is formed continuously with the first fixed electrode.

2. The MEMS device according to claim 1, wherein a voltage is applied to the well so that the well is in a depletion state.

3. The MEMS device according to claim 2, satisfying Vp<0, Vwell≧0, and 0<|Vp−Vwell|<|Vth|, where Vp is a bias voltage of the MEMS,
   Vwell is the voltage applied to the well below the MEMS, and Vth is a threshold voltage at which an inversion layer is formed in the well, wherein the semiconductor substrate is a p-type substrate while the well is the n-type well.

4. The MEMS device according to claim 2, satisfying Vp>0, Vwell<0, and 0<|Vp−Vwell|<|Vth|, where Vp is a bias voltage of the MEMS, Vwell is the voltage applied to the well below the MEMS, Vth is a threshold voltage at which an inversion layer is formed in the well, wherein the semiconductor substrate is an n-type substrate while the well is the p-type well.

5. The MEMS device according to claim 1, wherein the MEMS further includes a second fixed electrode formed on the insulating layer, the second fixed electrode being aligned with the movable electrode.

* * * * *